(12) United States Patent
Yang et al.

(10) Patent No.: US 6,764,920 B1
(45) Date of Patent: Jul. 20, 2004

(54) METHOD FOR REDUCING SHALLOW TRENCH ISOLATION EDGE THINNING ON TUNNEL OXIDES USING PARTIAL NITRIDE STRIP AND SMALL BIRD'S BEAK FORMATION FOR HIGH PERFORMANCE FLASH MEMORY DEVICES

(75) Inventors: Nian Yang, San Jose, CA (US); John Jianshi Wang, San Jose, CA (US); Unsoon Kim, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 17 days.

(21) Appl. No.: 10/126,840

(22) Filed: Apr. 19, 2002

(51) Int. Cl.[7] ............................................. H01L 21/76
(52) U.S. Cl. ...................... 438/424; 438/425; 438/439; 438/443; 438/452
(58) Field of Search ................................ 438/424, 425, 438/426, 439, 443, 452

(56) References Cited

U.S. PATENT DOCUMENTS

| | | | | |
|---|---|---|---|---|
| 4,683,640 A | * | 8/1987 | Faraone ...................... 437/41 |
| 4,986,879 A | * | 1/1991 | Lee ............................ 156/649 |
| 5,679,599 A | * | 10/1997 | Mehta ........................ 438/425 |
| 5,811,346 A | * | 9/1998 | Sur et al. .................... 438/424 |
| 6,087,243 A | * | 7/2000 | Wang ......................... 438/424 |
| 6,503,815 B1 | * | 1/2003 | Hsu ........................... 438/452 |

\* cited by examiner

Primary Examiner—Matthew Smith
Assistant Examiner—Renzo Rocchegiani

(57) ABSTRACT

A method of semiconductor integrated circuit fabrication. Specifically, one embodiment of the present invention discloses a method for reducing shallow trench isolation (STI) corner recess of silicon in order to reduce STI edge thinning on tunnel oxides (510) for flash memories (devices M and N). An STI process is implemented to isolate flash memory devices (devices M and N) in the semiconductor structure (200). In the STI process, a nitride layer (210) is deposited over a silicon substrate (280). An STI region (290) is formed defining STI corners (240) where a top surface (270) of the silicon substrate (280) and the STI region (290) converge. The STI region (290) is filled with an STI field oxide and planarized until reaching the nitride layer (210). A local oxidation of silicon (LOCOS) is then performed to oxidize the top surface (270) of the silicon substrate adjacent to the STI corners (240). Oxidized silicon is grown to boost the thickness of a later formed tunnel oxide layer (510) at the STI corners (240).

22 Claims, 6 Drawing Sheets

METHOD FOR REDUCING SHALLOW TRENCH ISOLATION EDGE THINNING ON TUNNEL OXIDES USING PARTIAL NITRIDE STRIP AND SMALL BIRD'S BEAK FORMATION FOR HIGH PERFORMANCE FLASH MEMORY DEVICES

BACKGROUND OF THE INVENTION

1. Field of the Invention

The present invention relates to the field of microelectronic integrated circuits. Specifically, the present invention relates to a process for reducing shallow trench isolation edge thinning on tunnel oxides for high performance flash memories.

2. Related Art

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells, each of which includes a source, drain, floating gate and control gate to which various voltages are applied to program the cell with a binary 1 or 0, or erase all of the cells as a block.

As flash memory technology progresses, the density of the memory cells, as well as, the speed of the flash memory increases. Device isolation is necessary in order to achieve higher cell densities. Without proper device isolation, local cells as well as peripheral devices will adversely interfere and interact with each other. Device isolation helps reduce parasitic conduction paths, series resistances, current leakage, and helps maintain threshold voltage control.

Shallow trench isolation (STI) is one technique for device isolation. The STI technique improves the scaling of devices in order to increase cell density throughout the circuit. Currently, the formation of STI precedes the formation of tunnel oxide during device fabrication in the integrated circuit. Further, various clean and etch steps are performed on sacrificial oxide layers prior to tunnel oxide formation in order to achieve a good silicon surface for tunnel oxidation.

However, STI techniques in the prior art undesirably result in tunnel oxide edge thinning at the corners of the memory cell near the boundary with the STI field oxide. More specifically, the cleaning and etching of the sacrificial oxide layers usually consume the STI field oxide and thus lead to STI recess at the corners of the memory cell near the boundary with the STI field oxide. The STI recess in turn leads to the tunnel oxide edge thinning.

Prior Art FIG. 1 is a cross-sectional view of an integrated circuit 100 containing a flash memory device. The portion illustrated in the flash memory device is the active region 120 containing either the source or drain. A tunnel oxide layer 110 is placed on top of the active region 120. Also an STI trench region 130 is shown separating the active region 120 of the flash memory device from other devices, including peripheral devices.

Prior Art FIG. 1 illustrates the thinning of the tunnel oxide region 110 at the corner of the active region 120 of the flash memory device. Distance B in the tunnel oxide region 110 at the corner of the active region 120 is shown to be thinner than distance A, which lies beyond the corner.

Tunnel oxide edge thinning at the corner of the active region 120 of the flash memory device results in poorer memory cell performance, such as, current leakage and fast bit memory erase. More specifically, the fast bit memory erase results in a non-uniform erase of the memory cells throughout the circuit Those cells with fast bit erase tendencies have a lower than desired threshold voltages. Furthermore, the tunnel oxide edge thinning can lead to other performance issues, such as, enhanced gate leakage current, over-erase, decreased gate oxide charge to breakdown, reduced long term oxide integrity, etc.

Thus, a need exists for a fabrication technique that provides better distribution of the tunnel oxide layer on a flash memory device. A further need exists for a fabrication technique that provides less tunnel oxide edge thinning at the corners of a flash memory device near the STI region.

SUMMARY OF THE INVENTION

The present invention provides a method of semiconductor structure fabrication wherein the method provides better distribution of a tunnel oxide layer on a flash memory device. Also, the present invention provides for a method of semiconductor fabrication that provides less tunnel oxide edge thinning at the shallow trench isolation (STI) corners of a flash memory device where the STI region and a top surface of the silicon substrate in the active source/drain region of a flash memory device converge.

Specifically, one embodiment of the present invention discloses a method for reducing shallow trench isolation (STI) corner recess of silicon in order to reduce STI edge thinning on tunnel oxides for flash memories. An STI process is implemented to isolate semiconductor devices in an integrated circuit in a semiconductor structure. In the STI process, a nitride layer is deposited over a silicon substrate. An STI region is formed in the silicon substrate defining STI corners where a top surface of the silicon substrate and the STI region converge. The STI region is filled with an STI field oxide. The STI field oxide is planarized until reaching the nitride layer. A local oxidation of silicon (LOCOS) is performed to oxidize the top surface of the silicon substrate that is under the nitride layer and adjacent to the STI corners.

The local oxidation forms an oxidized layer of silicon at the STI corners in a LOCOS bird's beak formation to boost the thickness of a later deposited or thermally grown tunnel oxide layer on a semiconductor flash memory device. The LOCOS process forms a small bird's beak formation. In one embodiment, to aid in the oxidation of the silicon in the bird's beak formation, the nitride layer is partially stripped down to a thickness of approximately 700 Angstroms. The partial stripping of the nitride layer also allows for control of the amount of field oxide within the STI region.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

PRIOR ART

DETAILED DESCRIPTION OF THE INVENTION

Reference will now be made in detail to the preferred embodiments of the present invention, a method of semiconductor fabrication for reducing the shallow trench isolation (STI) edge thinning of tunnel oxides at the corners of semiconductor flash memory devices. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a method of semiconductor structure fabrication wherein the method provides better distribution of a tunnel oxide layer on a flash memory device. Also, the present invention provides for a method of semiconductor fabrication that provides less tunnel oxide edge thinning at the shallow trench isolation (STI) corners of a flash memory device where the STI region and a top surface of the silicon substrate in the active source/drain region of a flash memory device converge.

Figure 4:
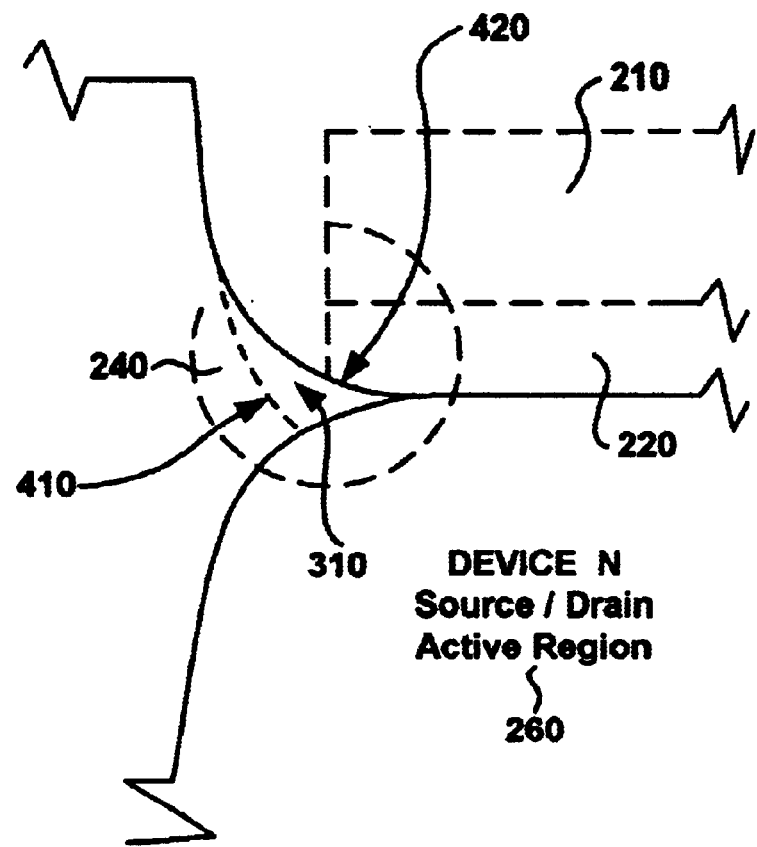
FIG. 4 is a cross sectional view of a semiconductor flash memory device illustrating the reduced recess of silicon at the STI corner due to the growth of oxidized silicon through the LOCOS process, in accordance with one embodiment of the present invention.
Figure 5:
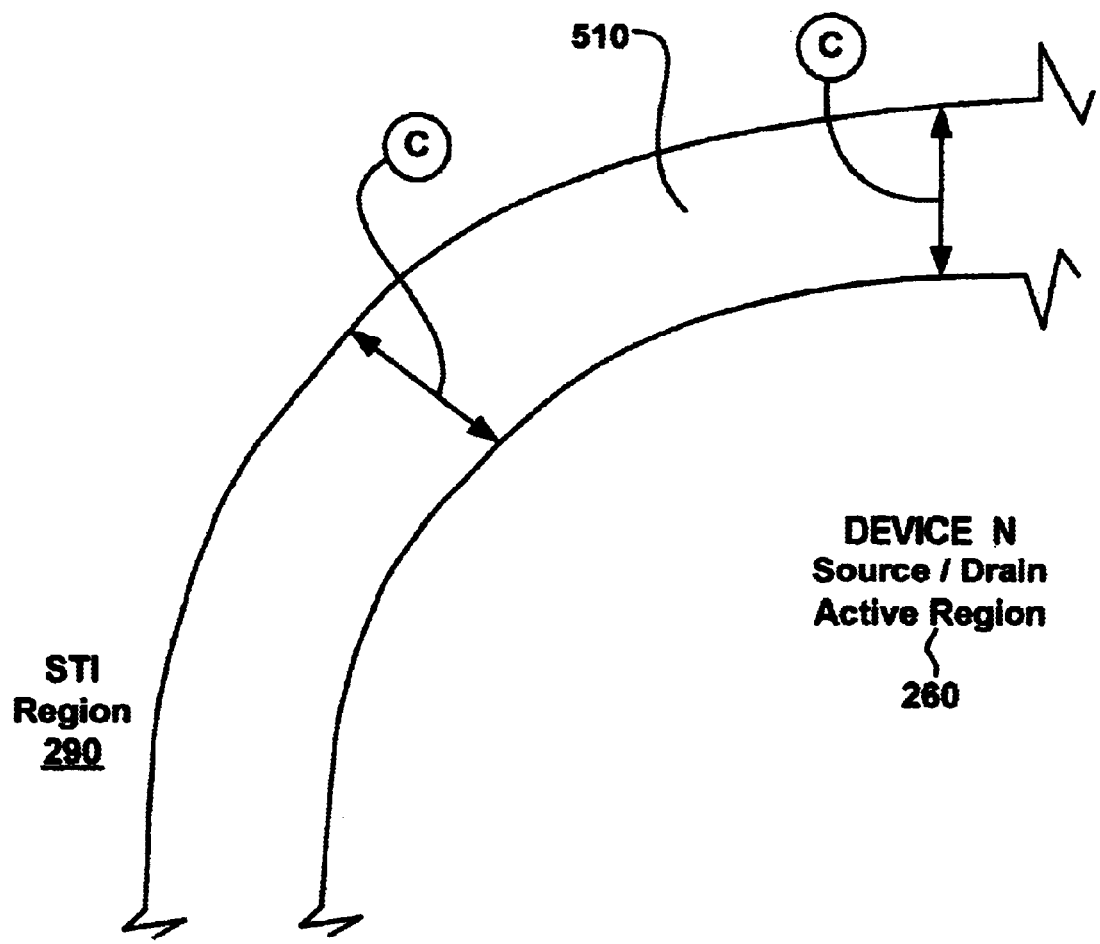
FIG. 5 is a cross sectional view of a semiconductor flash memory device illustrating the reduced edge thinning of the tunnel oxide layer at an STI corner due to the growth of oxidized silicon through the LOCOS process, in accordance with one embodiment of the present invention.
Figure 6:
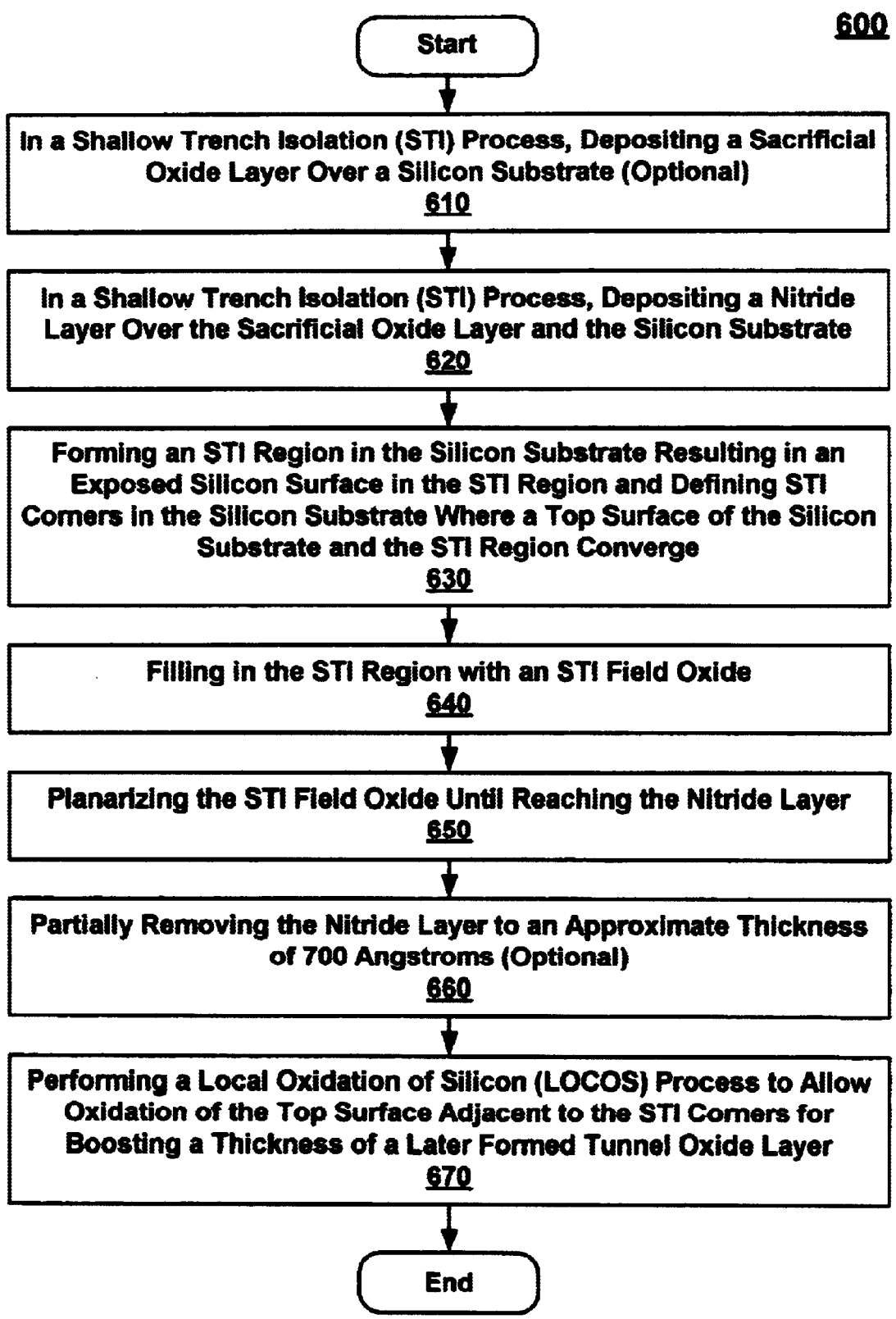
FIG. 6 is a flow diagram illustrating steps in a method of reducing STI edge thinning on tunnel oxides for high performance semiconductor flash memory devices, in accordance with one embodiment of the present invention.

The flow chart 600 of FIG. 6 in combination with FIGS. 2 through 5 illustrate the fabrication of a semiconductor structure with reduced STI edge thinning of the tunnel oxide layer of semiconductor flash memory devices.

Referring now to FIG. 6, the method of fabrication with reduced STI edge thinning is disclosed and begins in a STI process implemented for semiconductor device isolation, in accordance with one embodiment of the present invention. The STI process improves the scaling of semiconductor devices in order to increase cell density throughout the integrated circuit formed on a semiconductor substrate. In the present embodiment, the formation of STI precedes the formation of tunnel oxide during circuit fabrication. Further, various clean and etch steps are performed on various sacrificial oxide layers prior to tunnel oxide formation in order to achieve a good silicon surface for tunnel oxidation.

Figure 1:
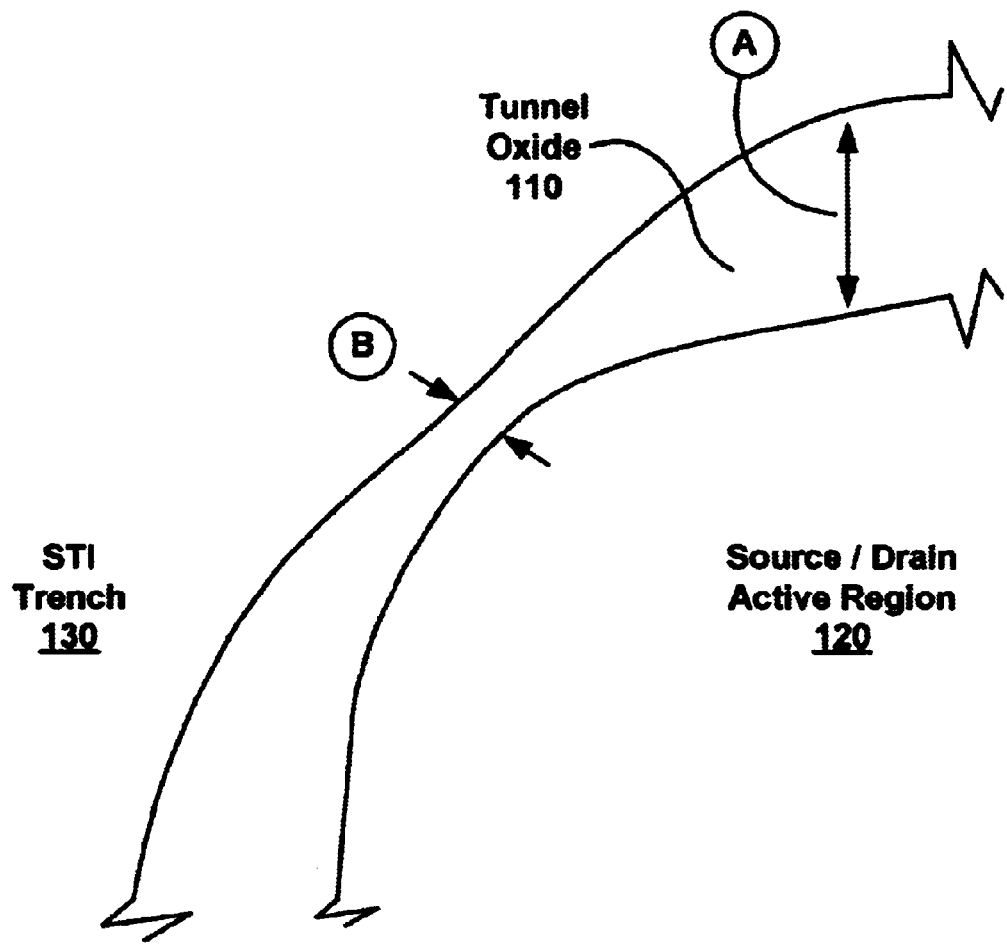
FIG. 1 is a cross sectional view of a semiconductor flash memory device illustrating the edge thinning of a tunnel oxide layer at a shallow trench isolation (STI) corner.
Figure 2:
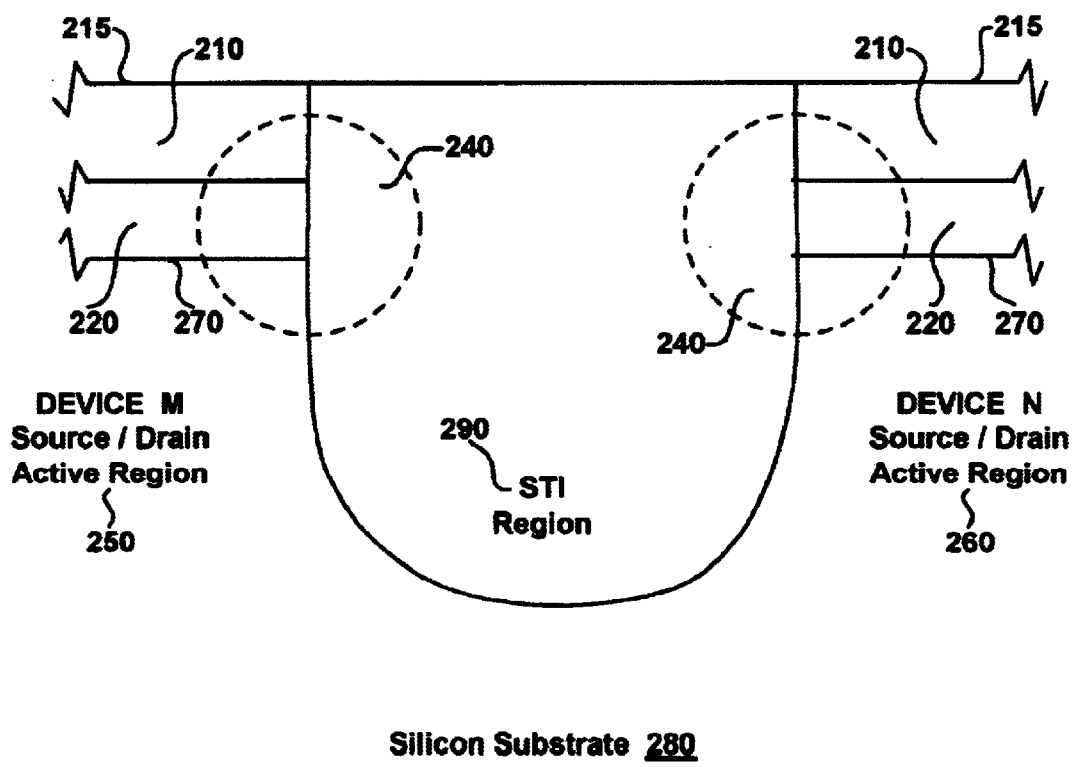
FIG. 2 is a cross sectional view of a semiconductor structure illustrating the local oxidation of silicon (LOCOS) process to form a bird's beak of oxidized silicon at STI corners of flash memory devices, in accordance with one embodiment of the present invention.

The method illustrated in flow chart 600 begins in a conventional STI process. In steps 610 and 620, a sacrificial oxide layer and a nitride layer are deposited over a silicon substrate, respectively. FIG. 2 is a cross sectional view of a semiconductor structure 200 illustrating the steps 610 and 620 of FIG. 6. FIG. 2 illustrates an STI trench region 290 with adjacent semiconductor device M and semiconductor device N in the formation of an integrated circuit in the semiconductor structure 200. For purposes of illustration, semiconductor device M and N are flash memory devices; however, other embodiments of the present invention are well suited to fabrication of any semiconductor transistor devices.

The present embodiment deposits a sacrificial oxide layer 220 over a top surface 220 of a silicon substrate 280, in optional step 610 to provide added protection from later fabrication steps for the top surface 270. Step 610 is performed before any formation of the STI region 290.

In step 620, the present embodiment deposits a nitride layer 210 over the top surface 270. If the sacrificial oxide layer 220 was previously deposited over the top surface 270, the nitride layer would be deposited on top of the sacrificial oxide layer 220, as is shown in FIG. 2. Step 620 is also performed before any formation of the STI region 290.

In step 630, the present embodiment forms the STI region 290 in the silicon substrate 280. The STI region 290 provides for semiconductor device isolation between flash memory device M with source/drain active region 250 and flash memory device N with source/drain active region 260. A masking and etching of the nitride layer 210 results in the formation of the STI region 290.

Performance of the STI process results in the formation of a clean STI region 290 complying to tight tolerances. As a result, formation of the STI region 290 allows for higher scalability of semiconductor devices in a semiconductor structure.

In addition, STI corners 240 in the silicon substrate are formed in the active regions of semiconductor flash memory devices M and N. The s corners 240 are defined generally as the corner where the top surface 270 of the source/drain active regions 250 and 260 of flash memory devices M and N, respectively, and the STI region 290 converge. More specifically, the STI corners 240 are where the top surface 270 and the STI region 290 converge.

In step 640, the STI region 290 in the semiconductor structure 200 is filled in with a field oxide, hereinafter referred to as STI field oxide. In one embodiment, the STI region 290 is filled with tetraethylorthosilicate (TEOS).

In step 650, the STI field oxide is planarized down until the surface 215 of the nitride layer 210 is reached. In one embodiment, a chemical mechanical planarization (CMP) process is employed to polish the STI field oxide down to the nitride surface 615.

In optional step 660, the nitride layer 210 is partially removed. Depending on the thickness of the nitride layer, the nitride layer 210 is stripped or etched until a thickness of the nitride layer is approximately 700 Angstroms. This is to aid in the oxidation of the silicon top surface 270 under the nitride layer 210 near the STI corners 240.

In step 670 of flow chart 600, a local oxidation of silicon (LOCOS) is performed on the semiconductor structure 200.

In a LOCOS process, oxidation of the nitride layer 210 occurs very slowly. As such, the nitride acts a barrier to the diffusion of oxygen and prevents oxidation of the silicon located directly below the nitride. As a result, oxidation of silicon can be selectively isolated in the LOCOS process. FIG. 2 illustrates the oxidation of the exposed silicon in the oxidation of silicon region 310.

Since oxidation consumes a certain amount of silicon (approximately 44 percent) for oxidation, the resultant oxide can reach into the STI corners 240 of the semiconductor flash memory devices M and N. A localized bird's beak formation of oxide is formed in the STI corners 240. In addition, since the LOCOS process forms a small bird's beak, the active region of the semiconductor devices adjacent to the STI region 290 is not adversely affected. In fact, the oxidation of silicon at the STI corners 240 is a performance enhancer in the present embodiment, since the small bird's beak formation at the STI corners 240 reduces STI corner recess during the complete removal of the nitride layer 210 in preparation of a later formed tunnel oxide layer. The resultant flash memory device has better distribution of the tunnel oxide layer through the STI region 240 by boosting the tunnel oxide with the oxidation layer formed in the LOCOS bird's beak formation.

In one embodiment, the LOCOS process is performed using a wet oxidation process including hydrogen. In another embodiment, the LOCOS process is performed using a dry oxidation process with oxygen ($O_2$).

Figure 3:
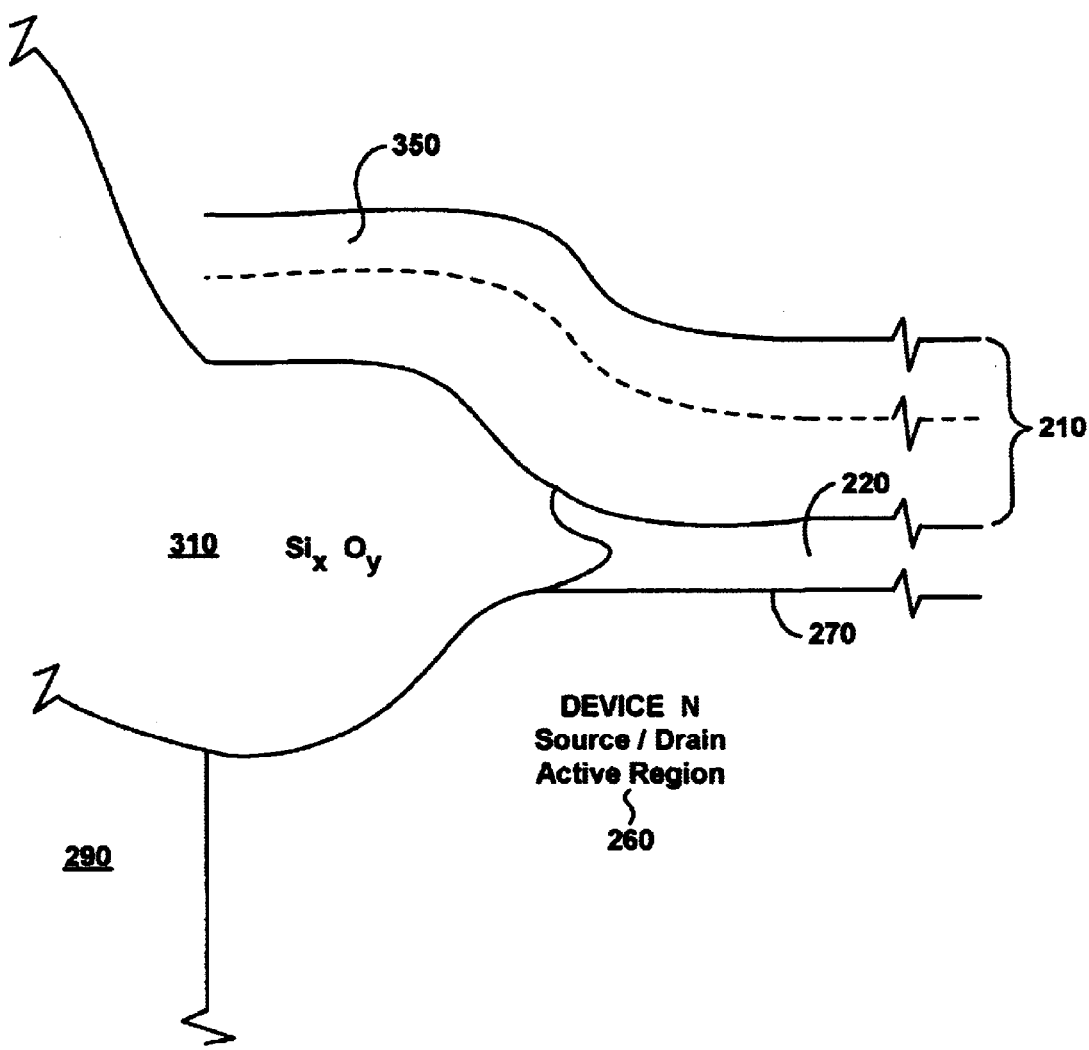
FIG. 3 is a cross sectional view of a semiconductor device illustrating the formation of the bird's beak of oxidized silicon through the LOCOS process at the STI corners of flash memory devices, in accordance with one embodiment of the present invention.

FIG. 3 is a representative close-up of region 240 of the STI corners 240 of semiconductor flash memory devices M and N. FIG. 3 is a cross-sectional view semiconductor substrate 200 illustrating the formation of a bird's beak of silicon oxide ($Si_xO_y$) in the oxidation region 310 near the STI corner 240 specifically for semiconductor flash memory device N. In the LOCOS process of step 670, a lateral diffusion of oxygen occurs under the edges of the nitride layer 210, which, causes some of the silicon under the nitride layer 210 near the STI corners 240 to become oxidized. An oxidation layer 310, hereinafter referred to as STI corner oxide 310, is formed particularly in the STI corners 240.

As shown in FIG. 3, the oxidation of the silicon in the oxidation layer 310 under the nitride layer 210 expands the STI corner region 240 for device N with an STI corner oxide 310 layer of silicon oxide ($Si_xO_y$) in a small bird's beak formation. The resultant STI corner oxide 310 in the small bird's beak formation provides a boost to the thickness of the formation of tunnel oxide layer that is later deposited or thermally grown over the top surface 270 of the active regions 250 and 260 of semiconductor flash memory devices M and N, respectively.

In one embodiment, the formation of the layer of silicon oxide ($Si_xO_y$) is approximately 50 Angstroms in thickness. Formation of the STI corner oxide can occur in a process between approximately 800 to 1100 degrees Celsius (800–1100° C.) for approximately fourteen to forty minutes (14–40 minutes).

In another embodiment, the nitride layer 210 is partially removed prior to performing the LOCOS oxidation of silicon in step 660. FIG. 3 shows the removal of the nitride layer 210 in a region 350. The removal of nitride from region 350 aids in the oxidation of the silicon under the nitride layer 210 at the STI corners 240 to better form the STI corner oxide 310. The removal of the nitride layer 210 is performed until the nitride layer 210 is of an approximate depth of 700 Angstroms. In one embodiment, nitride is partially removed form the nitride layer 210 by 50 percent.

In addition partial stripping of the nitride layer 210 helps control the amount of field oxide formed within the STI region 290. The less nitride that is removed from the nitride layer 210, the more field oxide is formed within the STI region 290. Conversely, the more nitride that is removed from the nitride layer 210, the less field oxide is formed within the STI region 290.

In one embodiment, the partial removal of nitride layer 210 can be performed using a wet etch with a solvent (e.g., HFl, KOH, HF). In another embodiment, the partial removal of the nitride layer 210 can be performed using a dry etch. For example, dry etching of the nitride is accomplished using a reactive ion etching (RIE) process.

Without the performance of the LOCOS process on the semiconductor substrate 200, various cleaning and etching steps to remove the nitride layer 210, and more specifically, the sacrificial oxide layers over the active regions 250 and 260 of semiconductor flash memory devices M and N, respectively would also adversely remove STI field oxide in the STI corners 240, thus leading to STI recess. Over etching of the sacrificial oxide layer (e.g., layer 220) is necessary to ensure a clean top surface 270 can adequately receive the deposition of a later deposited tunnel oxide layer of the semiconductor flash memory devices M and N.

Unfortunately, over etching of the sacrificial oxide layer 220 also leads to a recess of the silicon surface 270 under the nitride layer 210 that defines the active region of the semiconductor devices M and N. FIG. 4 is a diagram 400 illustrating a cross-sectional view of the semiconductor structure 200 fabricated with and without a LOCOS local oxidation of the STI corners 240 of semiconductor device N.

Without the LOCOS process, line 410 illustrates the extent of the STI recess in the STI corner 240 of semiconductor flash memory device N. The gap between the sacrificial oxide layer 220 and the source/drain active region 260 is perpetuated to form voids under a later formed tunnel oxide layer (e.g., tunnel oxide layer 510 of FIG. 5) for the flash memory device N. The voids between the later formed tunnel oxide layer and the source/drain active region 260 leads to performance degradation of the resultant flash memory device B, such as, reduced gate oxide charge to breakdown, enhanced gate leakage current, over-erase, and long term reduction in oxide integrity.

On the other hand, with the implementation of the LOCOS process in the present embodiment, line 420 illustrates the reduction in the STI recess in the STI corner 240 of semiconductor flash memory device N. Line 420 is formed more in a line under the nitride layer 210 which helps to eliminate voids created without using the LOCOS process. Instead of creating a void under line 420 and above line 410. In one embodiment, a oxidization layer of silicon, the STI corner oxide 310, in bird's beak formation (see FIG. 3) fills the void under the under line 420 and above line 410. This bird's beak formation of STI corner oxide 310 helps boost the thickness of a later formed tunnel oxide layer.

In subsequent steps various cleaning and etching is performed on the nitride layer 210 and optional sacrificial oxide layer 220, as well as other later grown sacrificial oxide layers for forming the well and voltage threshold implants ($V_t$) of the semiconductor flash memory devices M and N. This is to ensure a clean top surface 270 of silicon for the later layer depositions for the formation of the semiconductor flash memory device, such as, the tunnel oxide layer 510, polysilicon-1 (poly-1) floating gate, a dielectric (e.g., oxide/nitride/oxide (ONO)) layer, and polysilicon-2 (poly-2) gate.

FIG. 5 is a diagram illustrating a cross-sectional view of the STI corner 240 associated with semiconductor flash memory device N with reduced thinning of the tunnel oxide 510 in the STI corner 240 due to etching of the nitride layer 210 and sacrificial oxide layer 220, because of the implementation of LOCOS process when forming the STI region. The portion illustrated in the flash memory device N is the active region 260 containing either the source or drain. A tunnel oxide layer 510 is placed on top of the active region 260. Also the STI region 290 is shown separating the active region 260 of the flash memory device N from other devices, such as, flash memory device M, or other peripheral transistor devices.

The distance C in the tunnel oxide region 510 at the STI corner 240 is shown to be uniform because of the boosting from the previously grown oxidized silicon, the STI corner oxide 310, from the LOCOS process. As a result reduced or no thinning of the tunnel oxide layer 510 is experienced in the STI corner region 240, which leads to enhanced performance of the semiconductor flash memory device N and all the flash memory devices in the semiconductor structure 200.

The preferred embodiment of the present invention, a method for semiconductor fabrication with reduced edge thinning of tunnel oxides for semiconductor flash memory devices, is thus described. While the present invention has been described in particular embodiments, it should be appreciated that the present invention should not be construed as limited by such embodiments, but rather construed according to the below claims.

What is claimed is:

1. A method of semiconductor integrated circuit fabrication comprising:
    a) in a shallow trench isolation (STI) process, depositing a nitride layer over a silicon substrate in a semiconductor structure;
    b) forming an STI region in said nitride layer and silicon substrate, said STI region defining STI corners where a top surface of said silicon substrate and said STI region converge;
    c) filling in said STI region with an STI field oxide;
    d) planarizing said STI region until reaching said nitride layer;
    e) partially stripping said nitride layer to aid in oxidation of said top surface in said STI corners; and
    f) oxidizing said semiconductor structure to allow oxidation of said top surface in said STI corners for boosting a later formed tunnel oxide layer.

2. The method of semiconductor integrated circuit fabrication as described in claim 1, wherein said partially stripping comprises:
    partially stripping said nitride layer until a thickness of said nitride layer is approximately 700 Angstroms.

3. The method of semiconductor integrated circuit fabrication as described in claim 1, wherein said partially stripping comprises:
    wet etching said nitride layer.

4. The method of semiconductor integrated circuit fabrication as described in claim 1, wherein said partially stripping comprises:
    dry etching said nitride layer using a Reactive Ion Etching (RIE) process.

5. The method of semiconductor integrated circuit fabrication as described in claim 1, wherein said partially stripping said nitride layer results in less STI field oxide in said STI region.

6. The method of semiconductor integrated circuit fabrication as described in claim 1, wherein said oxidizing in said f) is performed using a local oxidation of silicon (LOCOS) process.

7. The method of semiconductor integrated circuit fabrication as described in claim 1, wherein said f) comprises:
    forming a localized bird's beak oxidation layer of said silicon substrate at said STI corners.

8. The method of semiconductor integrated circuit fabrication as described in claim 1, wherein said d) further comprising:
    using a chemical mechanical planarization (CMP) process for said planarizing said STI region.

9. The method of semiconductor integrated circuit fabrication as described in claim 1, further comprising:
    g) completing said STI process; and
    h) forming flash memory devices located adjacent to said STI region.

10. The method of semiconductor integrated circuit fabrication as described in claim 9, wherein h) further comprises:
    h1) cleaning and etching to form a clean silicon surface on said top surface, said top surface defining active regions of said flash memory devices; and
    h2) forming said tunnel oxide layer over said top surface that is cleaned, said tunnel oxide layer having uniform thickness throughout said STI corners.

11. The method of semiconductor integrated circuit fabrication as described in claim 1, further comprising:
    depositing a sacrificial oxide layer between said nitride layer and said silicon substrate, said depositing said sacrificial oxide layer performed before a).

12. The method of semiconductor integrated circuit fabrication as described in claim 1 wherein said later formed tunnel oxide layer is associated with a flash memory device located adjacent to said STI region.

13. A method of semiconductor integrated circuit fabrication comprising:
    a) in a shallow trench isolation (STI) process, depositing a nitride layer over a silicon substrate in a semiconductor structure;
    b) forming an STI region in said nitride layer and silicon substrate, said STI region comprising an STI field oxide, and defining STI corners in said silicon substrate where a top surface of said silicon substrate and said STI region converge;
    c) partially stripping said nitride layer to aid in oxidation of said STI corners; and
    d) performing a local oxidation of silicon (LOCOS) process for reducing recess of said STI corners during later cleaning and etching in preparation of a later formed tunnel oxide layer.

14. The method of semiconductor integrated circuit fabrication as described in claim 13, wherein further comprises:
    d1) oxidizing said top surface in said STI corners for boosting said later formed tunnel oxide layer.

15. The method of semiconductor integrated circuit fabrication as described in claim 14, wherein d1) further comprises:
    forming an STI corner oxide layer to an approximate thickness of 50 Angstroms for boosting said later formed tunnel oxide layer.

16. The method of semiconductor integrated circuit fabrication as described in claim 13, wherein b) comprises:
    b1) filling in said STI region with said STI field oxide; and
    b2) planarizing said STI region until reaching said nitride layer.

17. The method of semiconductor integrated circuit fabrication as described in claim 13, further comprising:

e) removing said nitride layer;

f) completing said STI process; and g) forming a flash memory device including said later formed tunnel oxide layer.

18. The method of semiconductor integrated circuit fabrication as described in claim 17, wherein g) further comprises:

g1) cleaning and etching to form a clean silicon surface on said top surface, said top surface defining active regions of said flash memory devices; and g2) depositing said tunnel oxide layer over said top surface that is cleaned, said tunnel oxide layer having uniform thickness throughout said STI corners.

19. The method of semiconductor integrated circuit fabrication as described in claim 17, wherein g) further comprises:

g1) cleaning and etching to form a clean silicon surface on said top surface, said top surface defining active regions of said flash memory devices; and g2) thermally growing said tunnel oxide layer over said top surface that is cleaned, said tunnel oxide layer having uniform thickness throughout said STI corners.

20. The method of semiconductor integrated circuit fabrication as described in claim 13, wherein said top surface defines active regions of flash memory devices adjacent to said STI region.

21. The method of semiconductor integrated circuit fabrication as described in claim 13, wherein d) comprises:

performing a wet oxidation in said LOCOS process using hydrogen.

22. The method of semiconductor integrated circuit fabrication as described in claim 13, wherein d) comprises:

performing a dry oxidation in said LOCOS process using oxygen ($O_2$).

* * * * *